United States Patent [19]

McEachern et al.

[11] Patent Number: 5,742,153
[45] Date of Patent: Apr. 21, 1998

[54] COASTING POWER SUPPLY FOR AC POWER SYSTEM WAVEFORM MEASURING INSTRUMENT

[75] Inventors: Alexander McEachern, Oakland; Bryan D. Hord, San Francisco, both of Calif.

[73] Assignee: Basic Measuring Instruments, Santa Clara, Calif.

[21] Appl. No.: 173,922

[22] Filed: Dec. 28, 1993

Related U.S. Application Data

[63] Continuation of Ser. No. 931,718, Aug. 18, 1992, abandoned.

[51] Int. Cl.$^6$ .................................................. G05F 1/56
[52] U.S. Cl. ............................................ 323/282; 323/283
[58] Field of Search ................................. 323/282, 283, 323/349, 351; 363/62, 78, 39

[56] References Cited

U.S. PATENT DOCUMENTS

| | | | |
|---|---|---|---|
| 3,794,917 | 2/1974 | Martin et al. | 324/142 |
| 4,422,039 | 12/1983 | Davis | 324/119 |
| 4,843,306 | 6/1989 | Meuller | 324/74 |
| 4,949,030 | 8/1990 | Tse | 324/127 |
| 5,128,611 | 7/1992 | Konrad | 324/142 |

*Primary Examiner*—Adolf Berhane
*Attorney, Agent, or Firm*—Haverstock & Associates

[57] ABSTRACT

A power supply for an instrument that measures waveforms on AC (alternating current) power systems. Under ordinary circumstances, the power supply draws its power from the signal that the instrument measures. The power supply includes energy storage means. When the instrument must make a precise measurement that could be affected by the power drawn by its power supply, the instrument temporarily disconnects its power supply from the measured signal and draws power from its energy storage means, effectively coasting on the stored energy. At the conclusion of the precise measurement, the instrument reconnects its power supply to the signal being measured.

22 Claims, 4 Drawing Sheets

COASTING POWER SUPPLY FOR AC POWER SYSTEM WAVEFORM MEASURING INSTRUMENT

This is a file wrapper continuation of application Ser. No. 07/931,718, filed Aug. 18, 1992, now abandoned.

BACKGROUND OF THE INVENTION

1. Field of the Invention

This invention relates to power supplies for instruments that measure voltage waveforms on AC (alternating current) power lines. Further, this invention relates to power supplies for instruments that measure voltage waveforms on AC power lines and draw from the same power line voltage signal that is being measured.

2. Background of the Invention

Instruments that measure waveforms on AC (alternating current) power systems commonly obtain their operating power from the signals that they measure. For example, electronic watt-hour meters that measure voltage and current in order to calculate watts commonly obtain power for their electronic circuits from their voltage inputs. This power source is implied by Germer et al. in U.S. Pat. No. 5,059,896 and Ledier in U.S. Pat. No. 4,924,412, and is shown explicitly by Perry et al. in FIG. 2.3 of U.S. Pat. No. 4,978,911.

It is well known to those skilled in the art that common transformer/bridge rectifier/filter capacitor power supplies such as those shown by Perry et al. can draw non-sinusoidal current waveforms from the AC source to which they are connected, generally in the form shown by the current waveform 72 in FIG. 3 of the present invention. If the non-sinusoidal current drawn by the instrument power supply from the AC source is small with respect to the AC source impedance, the effect on the AC source voltage waveform will be minimal. This is generally the case for instruments connected directly to an utility source of AC power.

However, in the case of an AC source whose voltage is monitored by the instrument through a potential transformer, the current drawn by the instrument power supply from the potential transformer may be large relative to the source impedance of the low-voltage winding of the transformer, especially at harmonic frequencies. This has the undesirable effect that the voltage waveform at the measuring terminals of the instrument may be distorted in a way that reflects the characteristics of the instrument's own power supply, not characteristics of the AC power system being measured.

One prior-art method for eliminating this undesirable effect is to design the power supply in such a way that the current it draws from the AC power system closely approximates a sine wave with respect to time, of identical frequency and phase as the voltage waveform of the AC power system. These power supplies are commonly called "unity power factor" supplies, because they operate with a power factor that approaches a value of one. A commercial implementation of this method is found in the Micro Linear model ML4812 integrated circuit. This method succeeds in reducing harmonic currents, but requires electronic components that are both more expensive and less immune to power line disturbances than conventional transformer/bridge rectifier/filter capacitor approaches. Furthermore, in the case of extremely precise voltage harmonic measurements, the remaining harmonic currents of unity power factor supplies, although small, may be sufficient to significantly distort the voltage on the secondary of a potential transformer due to resonances in the potential transformer as discussed by A. P. Meliopoulos et al. in "Transmission Level Instrument Transformers and Transient Event Recorders Characterization for Harmonic Measurements", IEEE Paper # 92 SM 473-9 PWRD, Jul. 12, 1992.

Another prior art method to reduce power supply harmonic currents consists of placing passive filtering components, typically inductors and capacitors, on the AC power line that supplies current to the power supply. One implementation of this method is shown by Kravitz in U.S. Pat. No. 4,961,044. However, the components required to implement this method are bulky and difficult to incorporate in miniaturized instruments.

In applications where an instrument obtains its power from the AC power system that it measures, it is an object of the present invention to eliminate the effects on waveform measurements of harmonic currents drawn by the instrument power supply at minimal cost without significantly increasing the size of the instrument.

SUMMARY OF THE INVENTION

A power supply for an instrument that measures waveforms on AC (alternating current) power systems. Under ordinary circumstances, the power supply draws its power from the signal that the instrument measures. The power supply includes energy storage means. When the instrument must make a precise measurement that could be affected by the power drawn by its power supply, the instrument temporarily disconnects its power supply from the measured signal and draws power from its energy storage means, effectively coasting on the stored energy. At the conclusion of the precise measurement, the instrument reconnects its power supply to the signal being measured.

DETAILED DESCRIPTION OF A PREFERRED EMBODIMENT

Figure 1:
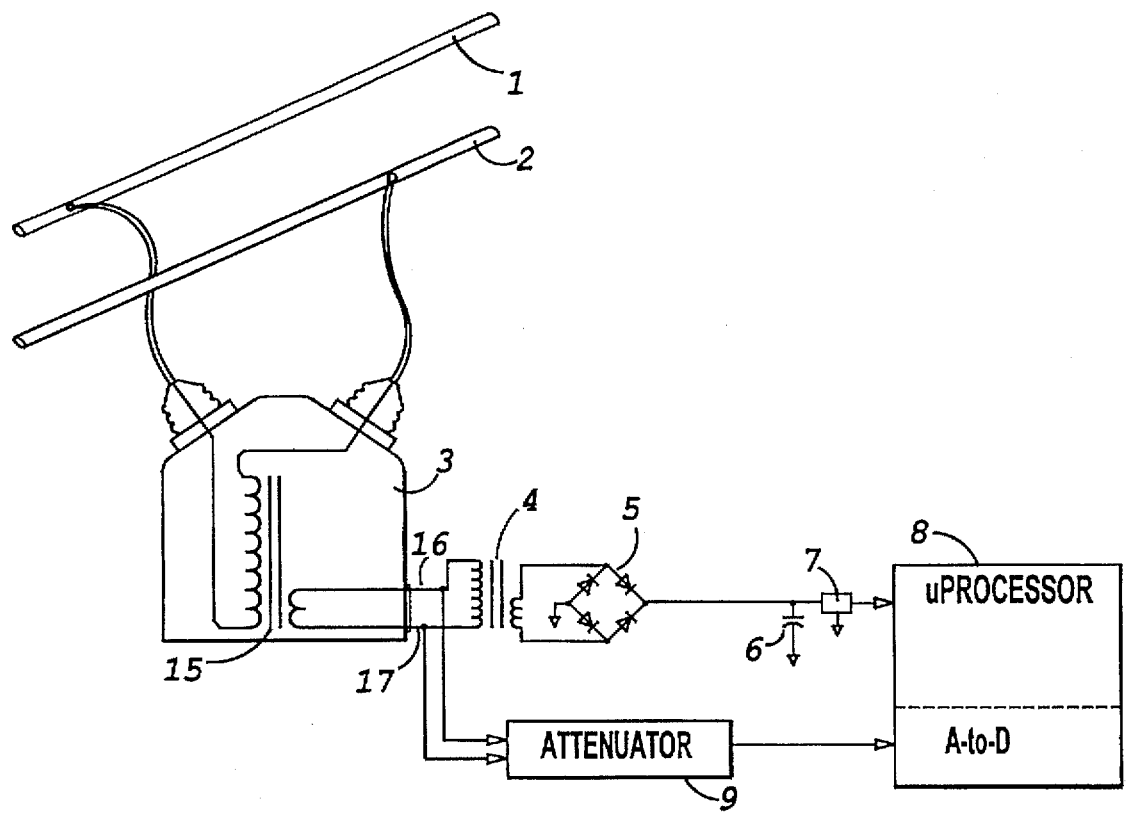
FIG. 1 shows a circuit diagram of prior art for voltage waveform measurements on AC power systems.

FIG. 1 illustrates a prior art circuit diagram for measuring voltage waveforms on medium voltage AC power distribution systems. Two distribution system conductors 1,2 carry medium voltage AC power, for example 34 kilovolt, 60 Hertz AC power. A potential transformer 15 enclosed in an oil-filled container 3 steps down the voltage, typically to a 120 volt signal, to make it more convenient to measure. An electronic instrument comprising components 3 through 9 measures the voltage waveform on two low voltage terminals 16,17 of the potential transformer 15. Specifically, the 120 volt signal from the low voltage terminals 16,17 of the potential transformer 15 is applied to an attenuator 9 which further reduces the voltage to prepare it for processing by an analog-to-digital converter (A-to-D) which is part of a single-chip microprocessor 8. At the same time, the 120 volt signal from the low voltage terminals 16,17 of the potential transformer 15 is also applied to a power transformer 4. The low voltage secondary winding of the power transformer 4 is rectified by a standard bridge rectifier 5, filtered by an electrolytic capacitor 6, and regulated by a three-terminal semiconductor voltage regulator 7 whose output provides the single-chip microprocessor 8 with power, typically 5 volts DC.

Figure 2A:
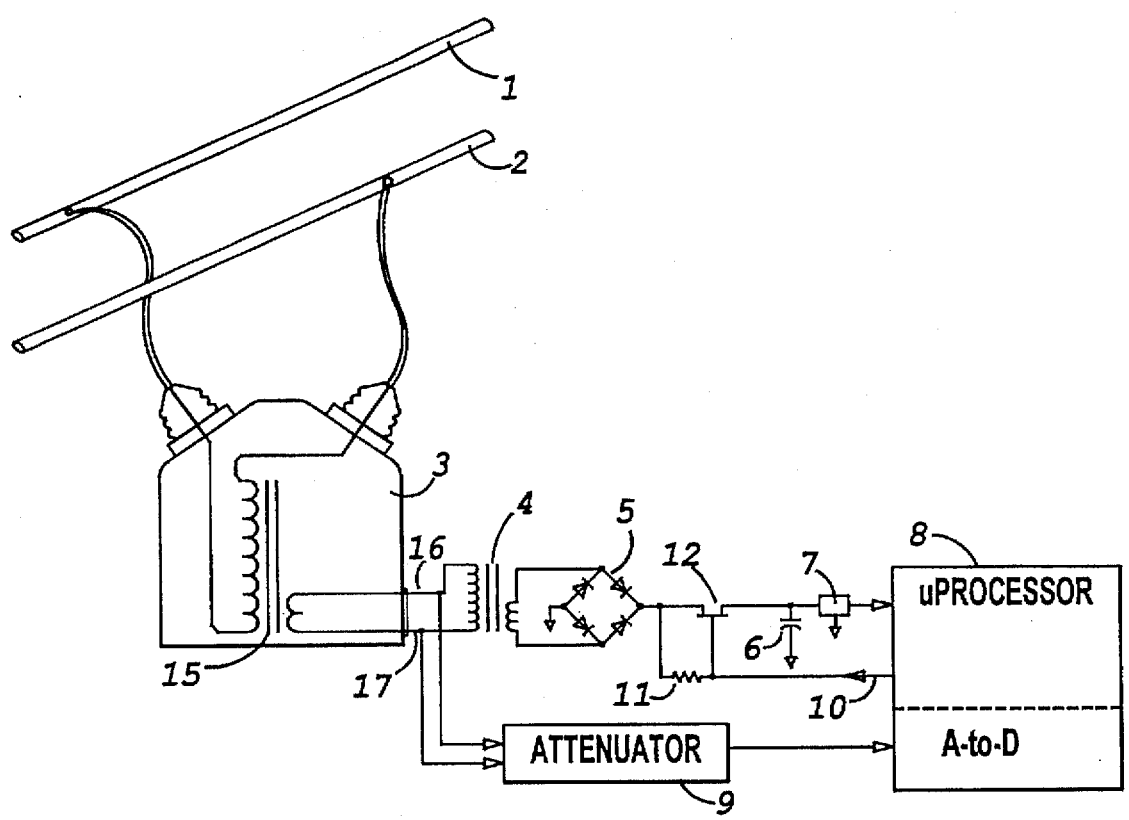
FIG. 2A shows a circuit diagram of an embodiment of the invention.

Turning now to FIG. 2, we see the preferred embodiment of the present invention, which improves the prior art power supply illustrated in FIG. 1 with the addition of an enhancement-mode power FET (field effect transistor) 12, a resistor 11, and a control signal line 10. The resistor 11 ensures that the gate of the transistor 12 is biased on under normal operation, which causes the invention to operate identically to the prior art circuit of FIG. 1 during such operation. The control signal line 10 allows the microprocessor to turn the transistor off when it desires to take a measurement of the signal from the power line.

The single-chip microprocessor 8 can periodically choose to use one of its open-collector outputs to activate the control signal line 10 and pull the gate of the transistor 12 to ground, thus shutting off current flow to the filter capacitor 6. In this state, referred to as "coasting", the single-chip microprocessor 8 obtains power only from the filter capacitor 6 and draws virtually no current from the potential transformer 15.

Figure 2B:
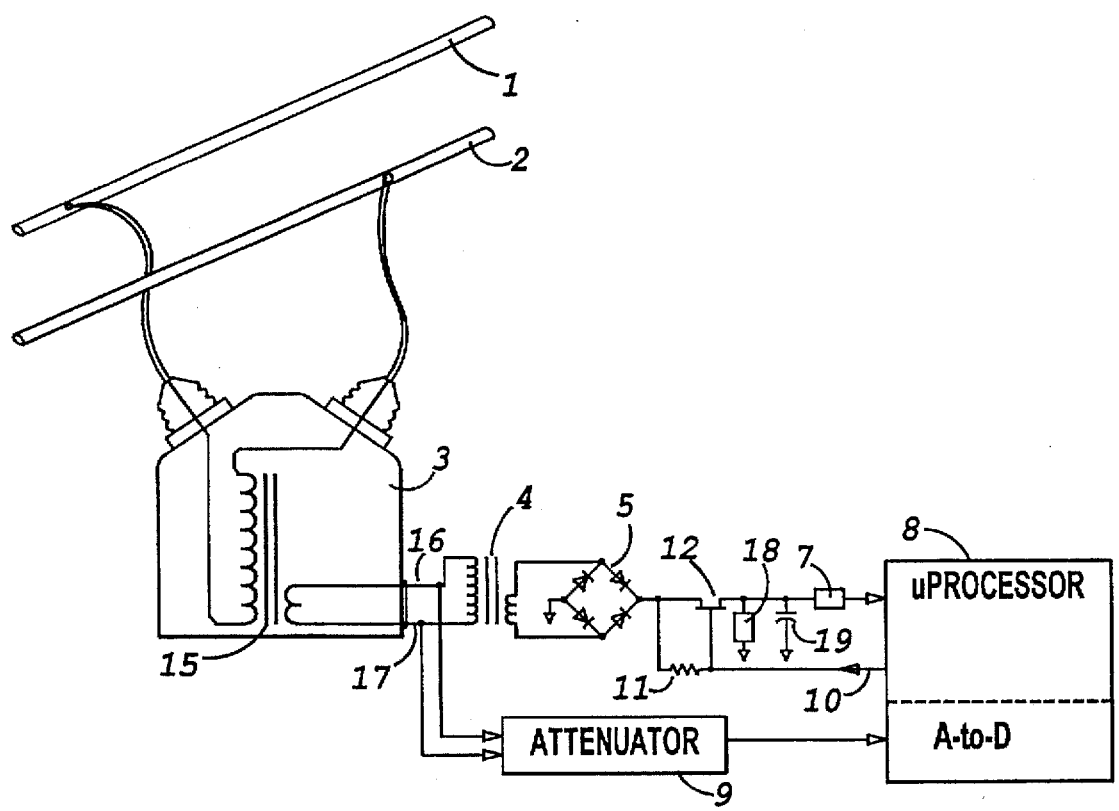
FIG. 2B shows a circuit diagram of another embodiment of the invention.

When the single-chip microprocessor 8 is instructed to take a measurement of the power line signal, it first activates the control signal line 10. The control signal line 10 is then pulled to ground and the gate of the transistor 12 is then also pulled to ground, the transistor is turned off and the microprocessor draws power only from the capacitor 6. The microprocessor 8 then takes its measurement of the power line signal while it is being powered from the energy stored in the capacitor 6. The microprocessor 8 then deactivates the control signal line 10 and the transistor 12 is turned back on, thus allowing the transformer 4 to supply power to the microprocessor 8 and to charge the capacitor 6. It may be possible to replace the capacitor 6 with a rechargeable battery or a battery 18 in parallel with a filtering capacitor 19, as shown in FIG. 2B.

Figure 3:
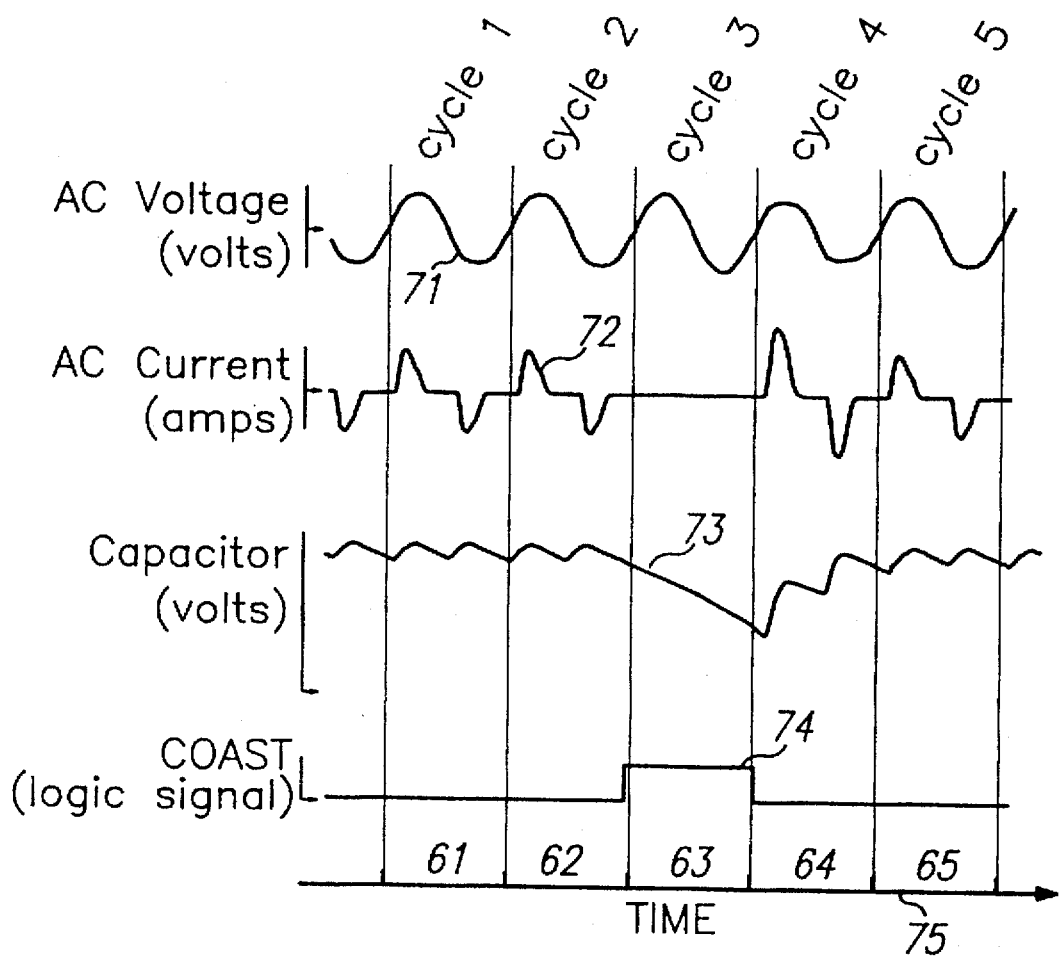
FIG. 3 shows a timing diagram of various signals in an embodiment.

Turning now to FIG. 3, we see waveforms of certain signals of the circuit shown in FIG. 2. Time runs along the horizontal axis 75. We see five cycles of the AC voltage 71 on the low-voltage terminals 16,17 of the potential transformer 15. In the first two cycles shown in the time divisions 61 and 62, we see the AC current 72 drawn from the low voltage terminals 15,16 of the potential transformer 15 being used to charge the capacitor 6, whose voltage 73 rises whenever the current 72 is injected. We can observe the typical distortion, or flattening of the peak of the sine wave, in the AC voltage 71 caused by the current pulses 72 during the time divisions 61 and 62.

During the next time division 63, the single-chip microprocessor 8 has determined that it should make a measurement of the voltage waveform 71. It asserts its COAST signal 74 which in the implementation shown in FIG. 2 is a negative-true open-collector output 10. When this signal is asserted, no power supply current 72 is drawn from the low voltage terminals 16,17 of the potential transformer 15, and we see the AC voltage waveform 71 without distortion contributed by the current 72 drawn by the instrument power supply. We also see the voltage 73 on the capacitor 6 fall, but not low enough to cause the output of the regulator 7 to fall outside of the requirements of the single-chip microprocessor 8. When the microprocessor 8 is finished with its waveshape measurement, it removes its assertion of its COAST logic signal 74, and we see during the time intervals 64 and 65 the current 72 once again being drawn from the low voltage terminals 16,17 of the potential transformer 15 to recharge the voltage 73 on the capacitor 6.

In the preferred embodiment, the transformer 4 has a ratio of 120:12, the full wave bridge 5 is implemented as four 1N4004 rectifiers, the resistor 11 is a ¼ watt metal-film resistor with a value of 100,000 ohms, the transistor 12 is a Motorola model IRF-520 enhancement-mode N-channel FET, the capacitor 12 is a 10,000 microfarad 15-volt electrolytic capacitor, the regulator 7 is a 7805 three-terminal regulator, and the single-chip microprocessor is a Motorola model 68HC05M4. These values are given to illustrate one possible implementation of the invention as defined by the appended claims.

In an alternate embodiment, the rectifiers of the full-wave bridge 5 may be gated rectifiers, such as silicon-controlled-rectifiers, thus allowing the bridge itself to be the switching element and eliminating the need for the transistor 12. Or in another embodiment, the contacts of an electromechanical relay may be substituted as a switching element for the transistor 12.

Various modifications may be made to the preferred embodiment without departing from the spirit and scope of the invention as defined by the appended claims.

We claim:

1. A power supply for an electronic circuit that measures an AC (alternating current) power line signal, the power supply drawing its power from the same power line signal that the electronic circuit is measuring, comprising:
  a. means for receiving the AC power line signal from a power line, said means for receiving coupled to the power line;
  b. means for converting the AC power line signal received from the power line to DC (direct current) power, said means for converting coupled to the means for receiving;
  c. means for supplying the electronic circuit with the DC power from the means for converting, said means for operating coupled to the means for converting and to the electronic circuit;
  d. means for storing DC power to be used by the electronic circuit, said means for storing coupled to the means for converting and to the electronic circuit; and
  e. means for disabling the means for supplying and furnishing power to the electronic circuit from the means for storing for a pre-determined interval of time; said means for disabling coupled to the means for supplying and the means for storing.

2. The power supply as claimed in claim 1 wherein the conversion means is comprised of a first transformer coupled to the AC power line and a second transformer coupled to the first transformer and to the electronic circuit.

3. The power supply as claimed in claim 1 wherein the storage means is comprised of a capacitor.

4. The power supply as claimed in claim 1 wherein the pre-determined interval of time is less than fifteen seconds.

5. The power supply as claimed in claim 2 wherein the means for disabling is comprised of a transistor, a resistor and a control signal from a microprocessor.

6. The power supply as claimed in claim 2 wherein the means for disabling is comprised of gated rectifiers and a control signal from a microprocessor.

7. The power supply as claimed in claim 8 wherein the means for disabling is comprised of an electromechanical relay and a control signal from a microprocessor.

8. A power supply for electronic circuit that measures an AC (alternating current) power line voltage waveform having a period, the power supply comprising:
  a. conversion means for converting AC power obtained from the power line to DC (direct current) power to operate the electronic circuit;

b. storage means for storing sufficient DC power to operate the electronic circuit for a first interval of time, the first interval of time being longer than one-half the period of the AC power line voltage waveform;

c. means for disabling the conversion means for a second interval of time, the second interval of time less than the first interval of time;

d. means for operating the electronic circuit using DC power from the storage means during the second interval of time; and e. means for re-enabling the conversion means at the conclusion of the second interval of time.

9. The power supply as claimed in claim 8 wherein the conversion means is comprised of a first transformer coupled to the AC power line and a second transformer coupled to the first transformer and to the electronic circuit.

10. The power supply as claimed in claim 8 wherein the storage means is comprised of a capacitor.

11. The power supply as claimed in claim 9 wherein the second interval of time is less than fifteen seconds.

12. An electronic instrument for measuring a waveform generated by a power source, wherein the power source supplies operating power to the electronic instrument via a power supply signal path, the instrument comprising:

a. a control circuit coupled to the power source for receiving and measuring the waveform via an attenuating signal path;

b. a switch for decoupling the control circuit from the power supply signal path when the waveform is being measured; and c. a storage element coupled to provide operating power to the control circuit when the control circuit is decoupled from the power source.

13. The electronic instrument according to claim 12 wherein the switch decouples the control circuit from the power supply signal path in response to a control signal generated by the microprocessor.

14. The electronic instrument according to claim 12 wherein the switch comprises a resistor-biased transistor coupled to receive a control signal from the control circuit.

15. The electronic instrument according to claim 12 wherein the storage element comprises a capacitor, further wherein the capacitor is charged by the power source via the power supply pathway and wherein the capacitor supplies power to the control circuit when the switch decouples the control circuit from the power supply signal path.

16. The electronic instrument according to claim 12 wherein the storage element comprises a DC battery.

17. The electronic instrument according to claim 16 wherein the DC battery is charged by the power source via the power supply signal path and wherein the DC battery supplies power to the control circuit when the switch decouples the microprocessor from the power supply signal path.

18. The electronic instrument according to claim 12 wherein the power supply signal path includes a voltage regulator and an AC-to-DC converter for converting AC voltages to an input voltage for the microprocessor.

19. The electronic instrument according to claim 12 wherein the attenuating signal path includes an analog-to-digital converter and an attenuator for converting the waveform into digital values.

20. The electronic instrument according to claim 12 wherein the control circuit comprises a microprocessor.

21. An electronic instrument for measuring a waveform generated by a power source, wherein the power source supplies operating power to the electronic instrument via an AC-DC converter, the instrument comprising:

a. a microprocessor coupled to the power source for receiving and measuring the waveform via an attenuating signal path, wherein the attenuating signal path includes (i) an attenuator for reducing voltage of the waveform and (ii) an analog-to-digital converter coupled to the attenuator for converting the waveform into digital signals;

b. a switch coupled between the microprocessor and the AC-DC converter for decoupling the microprocessor from the AC-DC converter when the waveform is being measured, wherein the switch is configured to respond to a control signal from the microprocessor; and c. a storage element coupled to provide operating power to the microprocessor when the microprocessor is decoupled from the power source.

22. The electronic instrument according to claim 21 wherein the switch comprises an enhancement mode power field-effect transistor.

* * * * *

UNITED STATES PATENT AND TRADEMARK OFFICE
CERTIFICATE OF CORRECTION

PATENT NO.    :    5,742,153

DATED         :    April 21, 1998

INVENTOR(S)   :    McEachern et al.

It is certified that error appears in the above-identified patent and that said Letters Patent is hereby correct as shown below:

IN THE REFERENCES SITED:

Please insert--

| | | | |
|---|---|---|---|
| 3,831,081 | 8/1974  | Weiss       | 323/22T |
| 4,504,779 | 3/1985  | Haman       | 323/349 |
| 4,538,102 | 8/1985  | Takagi et al. | 323 |
| 4,716,359 | 12/1987 | Numata et al. | 323/349 |
| 4,924,412 | 5/1990  | Leydier     | 364/483 |
| 4,961,044 | 10/1990 | Kravitz     | 323 |
| 4,978,911 | 12/1990 | Perry et al. | 324/142 |
| 5,059,896 | 10/1991 | Germer et al. | 324/142 |

A.P. Meliopoulos et al., "Transmission Level Instrument Transformers and Transient Event Recorders Characterization for Harmonic Measurements", IEEE Paper # 92 SM 473-9 PWRD, July 12, 1992--.

IN THE CLAIMS

In column 4, line 25, after "measuring," and before "comprising" insert --and from the same terminals--.

UNITED STATES PATENT AND TRADEMARK OFFICE
CERTIFICATE OF CORRECTION

PATENT NO. : 5,742,153
DATED : April 21, 1998
INVENTOR(S) : Alexander McEachern, et al.

It is certified that error appears in the above-identified patent and that said Letters Patent is hereby corrected as shown below:

In column 4, line 59, delete "claim 8" and insert --claim 2--.

Signed and Sealed this

Twenty-ninth Day of December, 1998

Attest:

BRUCE LEHMAN

Attesting Officer

Commissioner of Patents and Trademarks